United States Patent
Kang et al.

(10) Patent No.: US 12,411,537 B2
(45) Date of Patent: Sep. 9, 2025

(54) POWER REDUCTION FOR SYSTEMS HAVING MULTIPLE RANKS OF MEMORY

(71) Applicant: Samsung Electronics Co., Ltd., Suwon-si (KR)

(72) Inventors: Hyunjoon Kang, Suwon-si (KR); Taehun Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 41 days.

(21) Appl. No.: 18/159,022

(22) Filed: Jan. 24, 2023

(65) Prior Publication Data

US 2023/0236653 A1 Jul. 27, 2023

(30) Foreign Application Priority Data

Jan. 26, 2022 (KR) .................. 10-2022-0011791
Jul. 11, 2022 (KR) .................. 10-2022-0085278

(51) Int. Cl.
G06F 1/3234 (2019.01)
G06F 3/06 (2006.01)
G11C 5/14 (2006.01)
G11C 11/406 (2006.01)

(52) U.S. Cl.
CPC .......... *G06F 1/3275* (2013.01); *G06F 3/0622* (2013.01); *G06F 3/0658* (2013.01); *G06F 3/0659* (2013.01); *G06F 3/067* (2013.01)

(58) Field of Classification Search
CPC .... G06F 1/3275; G06F 3/0622; G06F 3/0658; G06F 3/0659; G06F 3/067
See application file for complete search history.

(56) References Cited

U.S. PATENT DOCUMENTS

| | | | |
|---|---|---|---|
| 7,761,724 B2 | 7/2010 | Rajan et al. | |
| 8,209,479 B2 | 6/2012 | Rajan et al. | |
| 8,972,673 B2 | 3/2015 | Rajan et al. | |
| 10,198,216 B2 | 2/2019 | Balakrishnan et al. | |
| 2003/0229821 A1 | 12/2003 | Ma | |
| 2008/0170456 A1* | 7/2008 | Yang | G06F 13/1636 365/222 |

(Continued)

FOREIGN PATENT DOCUMENTS

EP 3605542 A1 2/2020

OTHER PUBLICATIONS

EESR dated Jun. 20, 2023 for corresponding EP Patent Application No. 23153441.3.

(Continued)

*Primary Examiner* — Jaweed A Abbaszadeh
*Assistant Examiner* — Gayathri Sampath
(74) *Attorney, Agent, or Firm* — Harness, Dickey & Pierce, P.L.C.

(57) ABSTRACT

Provided are electronic devices and methods for power reduction in systems with multiple memory ranks. The electronic device includes a memory system including first and second memory ranks and a memory controller connected to the memory system and configured to control power of the memory system. The memory controller being configured to cause the first memory rank to enter an idle power down (IPD) state during memory access in which a data toggle time without a data bubble is equal to or greater than an IPD minimum gain duration in another bank access for the second memory rank.

20 Claims, 16 Drawing Sheets

(56) References Cited

U.S. PATENT DOCUMENTS

| | | | |
|---|---|---|---|
| 2013/0159657 A1* | 6/2013 | Zerbe | G11C 8/18 |
| | | | 711/167 |
| 2013/0268741 A1 | 10/2013 | Daly et al. | |
| 2014/0192583 A1 | 7/2014 | Rajan et al. | |
| 2017/0269861 A1* | 9/2017 | Lu | G06F 12/02 |
| 2020/0020384 A1 | 1/2020 | Zhao et al. | |
| 2021/0064119 A1* | 3/2021 | Mirichigni | G11C 11/2297 |
| 2021/0325956 A1* | 10/2021 | Adsure | G06F 1/3287 |
| 2022/0413759 A1* | 12/2022 | Shen | G06F 3/0604 |

OTHER PUBLICATIONS

JESD209-4 "Low Power Double Data Rate 4 (LPDDR4)" *JEDEC*, (Aug. 2014).
JESD209-5B "Low Power Double Data Rate 5 (LPDDR5)" *JEDEC*, (Jan. 2020).

\* cited by examiner

FIG. 6

| RPT (RANK PAGE TABLE) || |
|---|---|---|
| RANK 0 121 | BANK 0 | Page status (Open/Closed) |
| | BANK 1 | Page status (Open/Closed) |
| | ⋮ | ⋮ |
| | BANK N-1 | Page status (Open/Closed) |
| RANK 1 122 | BANK 0 | Page status (Open/Closed) |
| | BANK 1 | Page status (Open/Closed) |
| | ⋮ | ⋮ |
| | BANK N-1 | Page status (Open/Closed) |

| | REQUEST QUEUE | | | | | |
|---|---|---|---|---|---|---|
| Entry 0 | Occupancy flag | Schedule status | RANK/BANK | PH | PM | PC |
| Entry 1 | Occupancy flag | Schedule status | RANK/BANK | PH | PM | PC |
| ⋮ | ⋮ | ⋮ | ⋮ | ⋮ | | |
| Entry N−1 | Occupancy flag | Schedule status | RANK/BANK | PH | PM | PC |

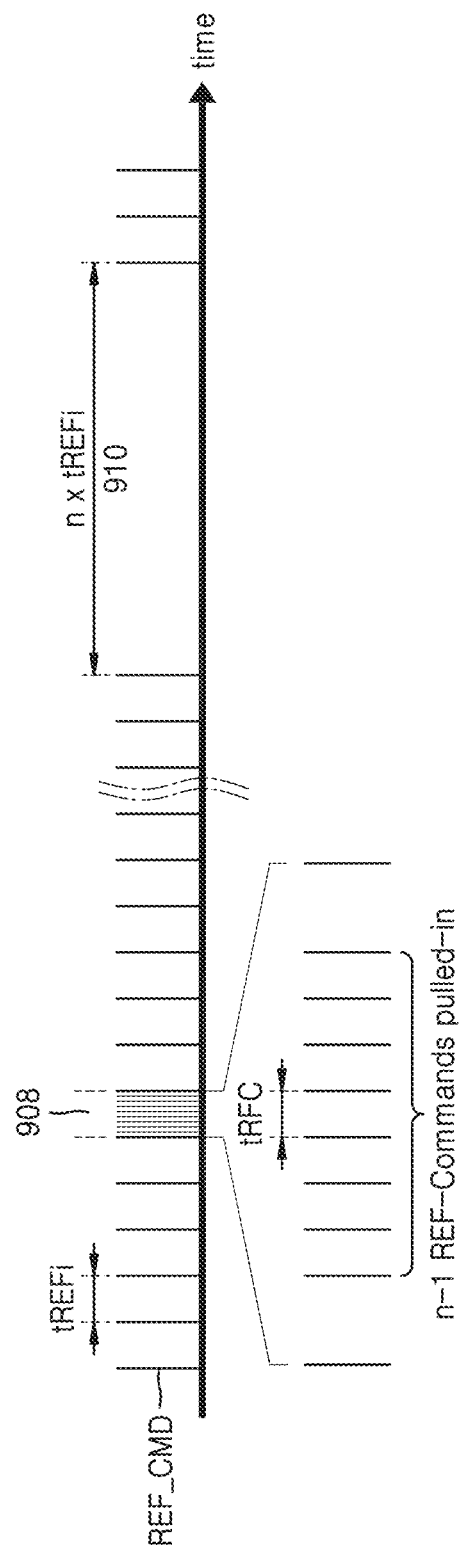

POWER REDUCTION FOR SYSTEMS HAVING MULTIPLE RANKS OF MEMORY

CROSS-REFERENCE TO RELATED APPLICATIONS

This application is based on and claims priority under 35 U.S.C. § 119 to Korean Patent Application Nos. 10-2022-0011791, filed on Jan. 26, 2022 and 10-2022-0085278, filed on Jul. 11, 2022, in the Korean Intellectual Property Office, the disclosures of which are incorporated by reference herein in their entireties.

BACKGROUND

The inventive concepts relate to apparatuses and methods, and more particularly, to devices and methods for power reduction in systems with multiple memory ranks.

Power consumption of electronic devices is crucial. Memory system power is an important factor in the budget of power of electronic devices and accounts for a significant portion of the total system power. A memory system includes a memory having a large amount of dynamic random access memory (DRAM) implemented on multiple individual DRAM chips.

Some electronic devices may include multiple DRAM chips and a memory controller. The memory controller may divide individual DRAM chips, among multiple DRAM chips, into logical and/or physical groups in terms of power control, addressing/memory access, and the like. For example, multiple DRAM chips may be included in one of multiple ranks, and may be divided into a target rank and a non-target rank. The target rank may include a DRAM chip that performs a memory access according to a memory request, and the non-target rank may include a DRAM chip that does not perform a memory access.

In low power double data rate synchronous DRAM (LPDDR SDRAM), a command timing delay is defined to be different depending on whether the rank is the same. In consideration of this, for some memories in which overhead due to rank interleaving occurs, the memory controller may perform scheduling such that the number of rank interleaving operations is reduced. When the number of rank interleaving operations is reduced, memory access to the target rank is continued, and the non-accessed non-target rank may be maintained in an idle non-power down or active non-power down state for a certain period and then enter an idle power down (IPD) and active power down (APD) state. In the idle non-power-down or active non-power-down state, IDD2N or IDD3N parameter current specified in LPDDR SDRAM is consumed, and in the IPD or APD state, IDD2P or IDD3P current is consumed.

The LPDDR SDRAM is mainly used in mobile electronic devices, such as smartphones, tablet personal computers (PCs), and ultra-books. As the capacity of a mobile operating system (OS) increases to support multi-tasking operations performed by mobile electronic devices, mobile electronic devices are required to have a lower power consumption characteristic and high-speed operation performance. Regarding the non-target rank, entering the IPD or APD state, in which less power is consumed than in the idle non-power down or active non-power down state, may be helpful in reducing power consumption of memory systems and mobile electronic devices.

SUMMARY

The inventive concepts provide electronic devices and methods for power reduction in systems having multiple memory ranks.

According to aspects of the inventive concepts, there are provided electronic devices including a memory system including first and second memory ranks and a memory controller connected to the memory system and configured to control power of the memory system, wherein the memory controller is configured to cause the first memory rank to enter an idle power down (IPD) state during memory access in which a data toggle time without a data bubble is equal to or greater than an IPD minimum gain duration in another bank access for the second memory rank.

According to aspects of the inventive concepts, there are provided electronic devices including a memory system including first and second memory ranks and a memory controller connected to the memory system and configured to control power of the memory system, wherein the memory controller is configured to cause the first memory rank to enter an active power down (APD) state based on there being an open page for the first memory rank during memory access in which a data toggle time without a data bubble is shorter than an idle power-down (IPD) minimum gain duration in another bank access for the second memory rank.

According to aspects of the inventive concepts, there are provided methods of operating an electronic device having a memory system including first and second memory ranks and a memory controller configured to control power of the memory system, including causing the first memory rank to enter an idle power down (IPD) state during memory access in which a data toggle time without a data bubble is equal to or greater than an IPD minimum gain duration in another bank access for the second memory rank and causing the first memory rank to enter an active power down (APD) state based on there being an open page for the first memory rank during memory access in which the data toggle time without the data bubble of the second memory rank is shorter than the IPD minimum gain duration.

BRIEF DESCRIPTION OF THE DRAWINGS

Example embodiments will be more clearly understood from the following detailed description taken in conjunction with the accompanying drawings in which:

FIG. 6 is a diagram illustrating a rank page logic circuit of FIG. 5;

FIG. 7 is a view illustrating a request queue of FIG. 5;

FIGS. 10A and 10B are diagrams illustrating an operation of a refresh controller of FIG. 9;

DETAILED DESCRIPTION

Figure 1A:
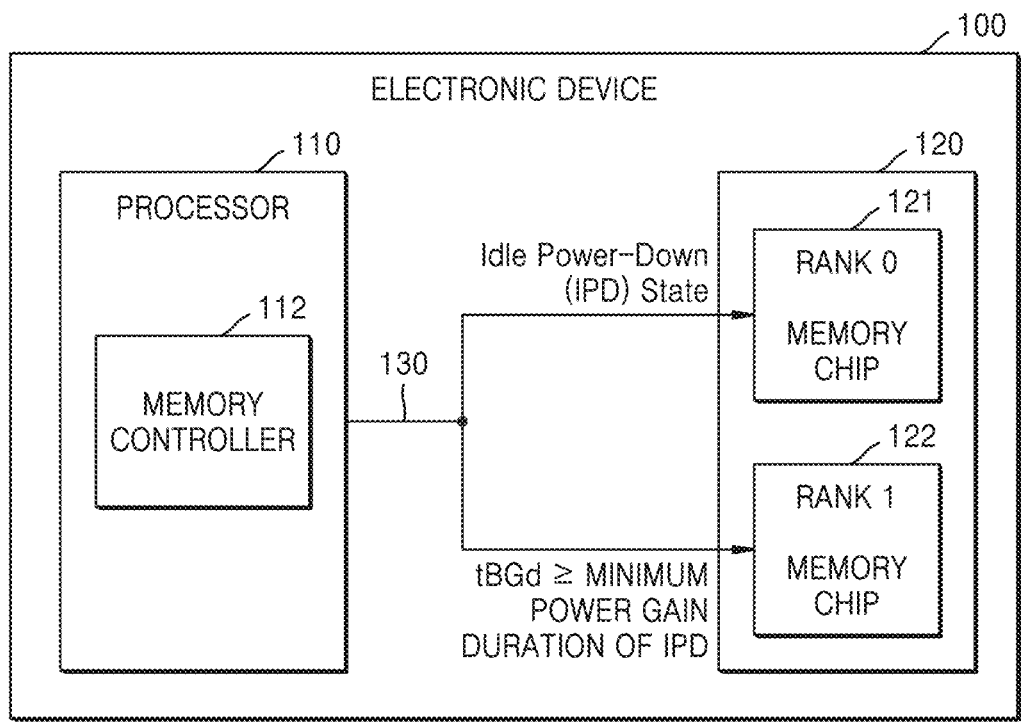
FIGS. 1A and 1B are block diagrams illustrating an electronic device according to example embodiments.
Figure 1B:
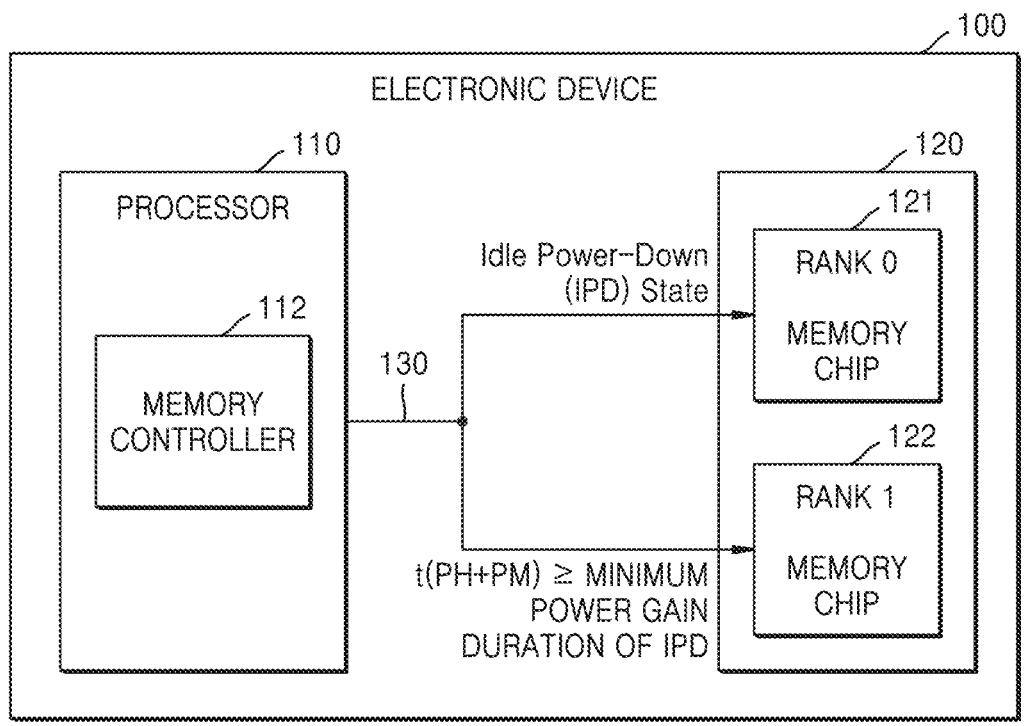
Figure 2:
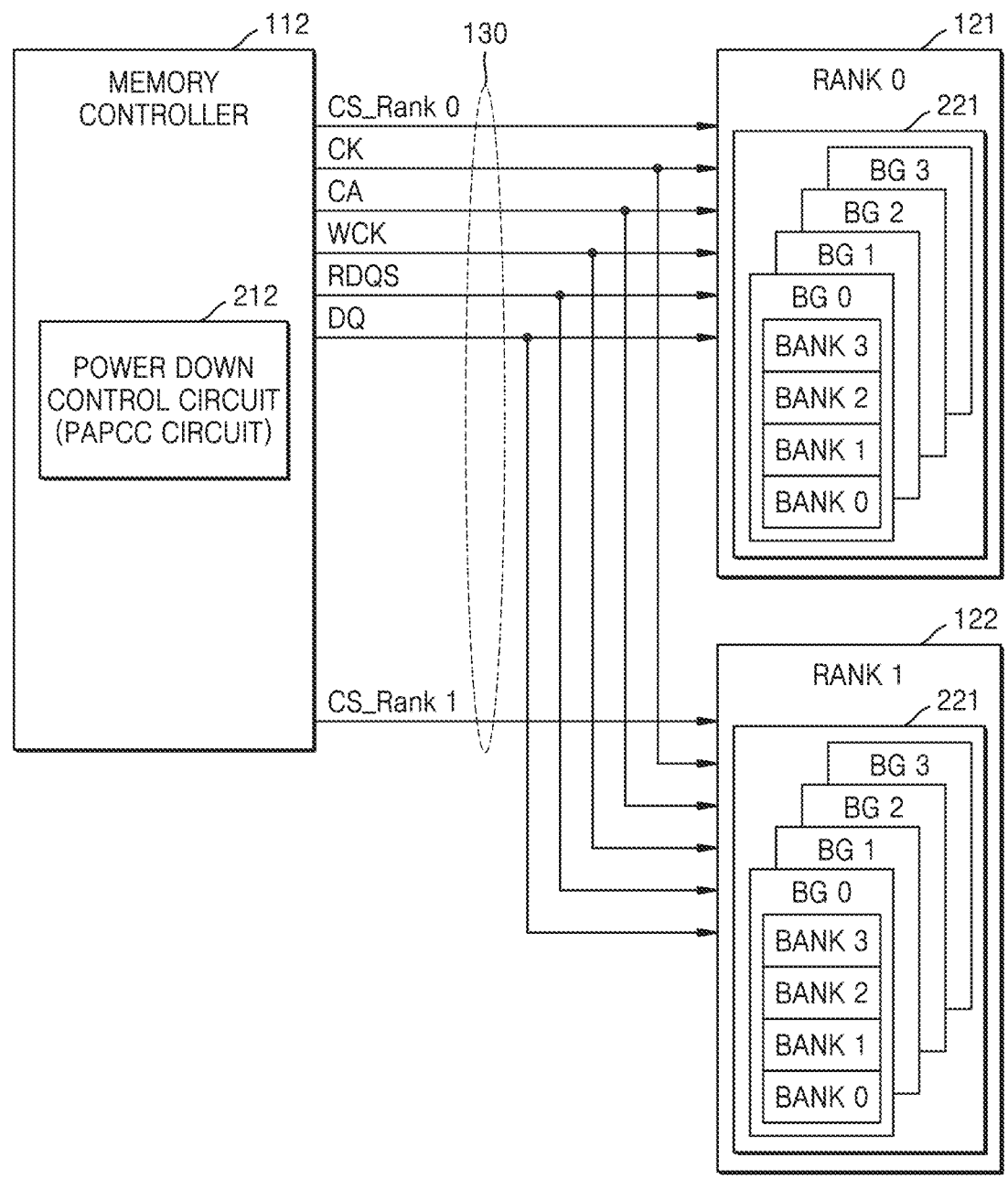
FIG. 2 is a diagram illustrating a channel between a memory controller of FIG. 1A and a memory system.
Figure 3:
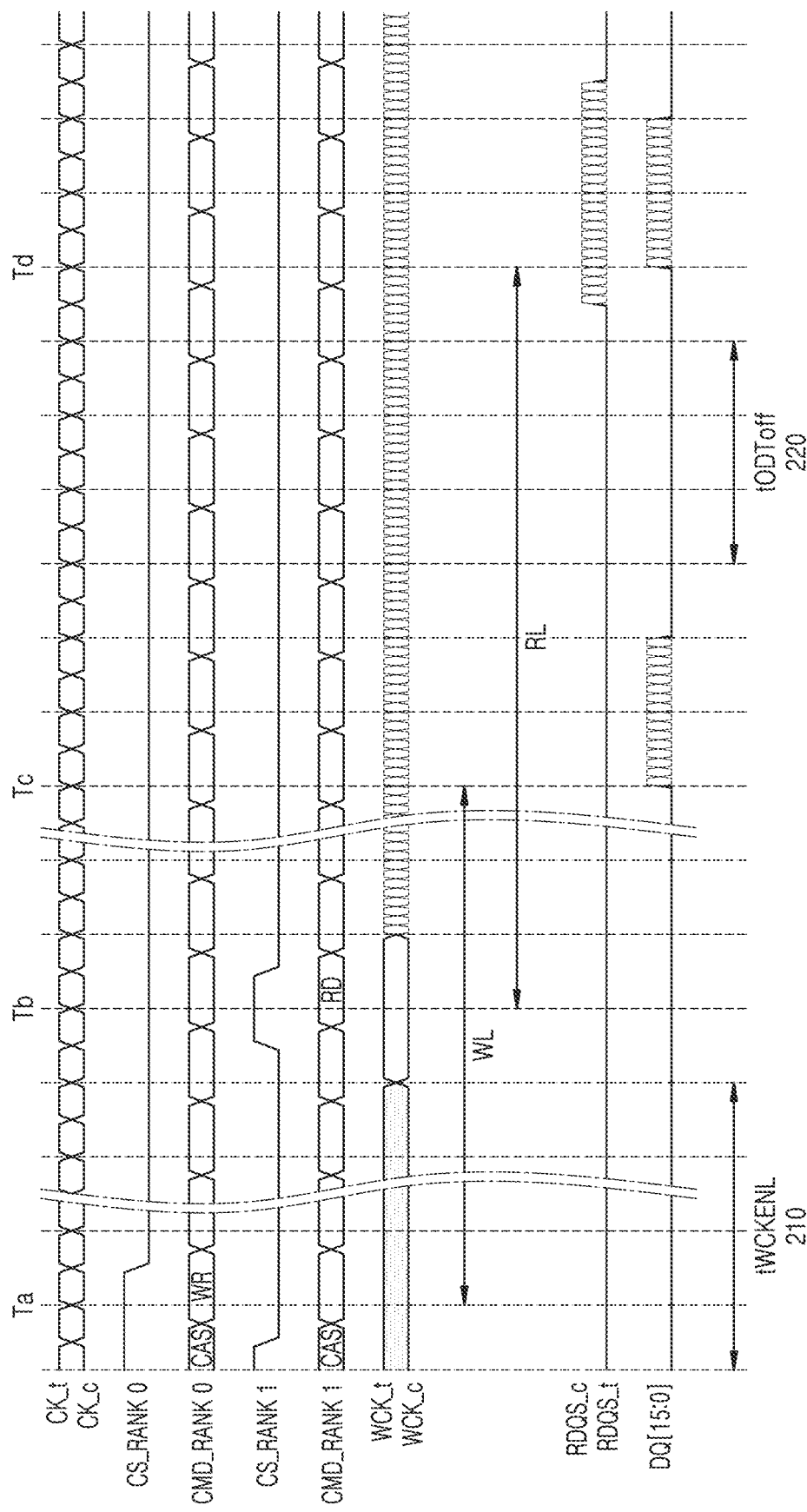
FIG. 3 is a timing diagram illustrating an operation of a memory system of FIG. 1A.
Figure 4:
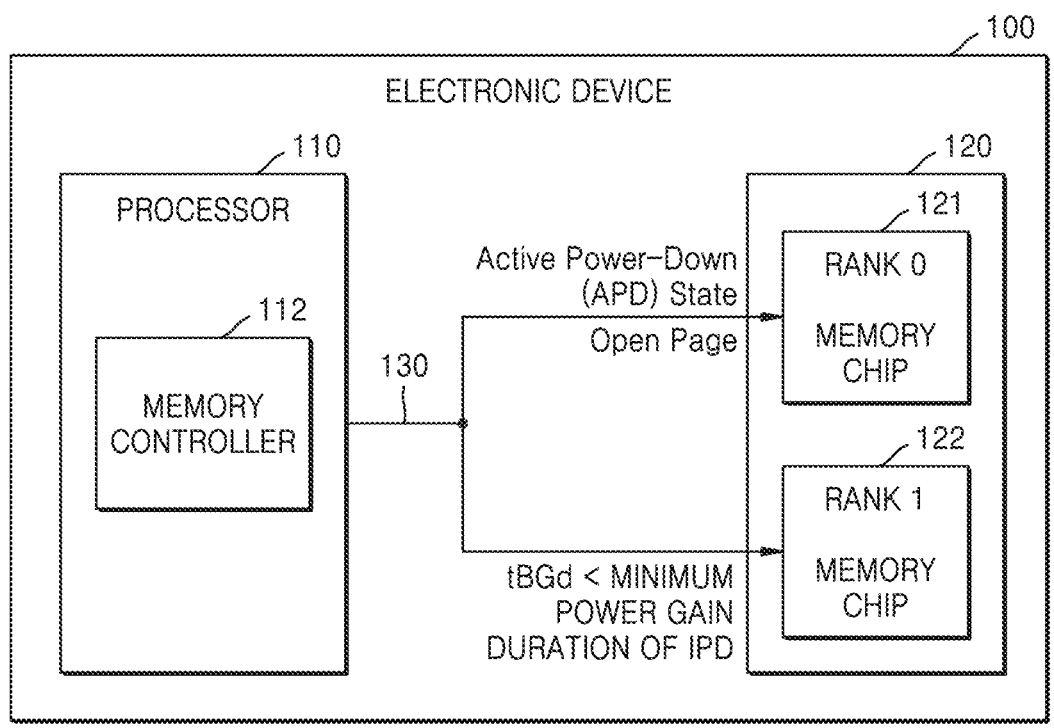
FIG. 4 is a view illustrating an operation state of the memory system of FIG. 1A.

FIGS. 1A and 1B are block diagrams illustrating an electronic device 100 according to example embodiments. FIG. 2 is a diagram illustrating a channel 130 between a memory controller 112 and a memory system 120 of FIG. 1A, and FIG. 3 is a timing diagram illustrating an operation of the memory system 120 of FIG. 1A. FIGS. 1A, 1B, and 4 are diagrams illustrating an operation state of the memory system 120 of FIG. 1A. It should be noted that, in the timing diagrams described in the following example embodiments, the horizontal axis and the vertical axis respectively represent time and voltage levels, and are not necessarily drawn to scale.

Referring to FIG. 1A, the electronic device 100 may include a processor 110 and a memory system 120. The electronic device 100 may be implemented to be included in, for example, a personal computer (PC) or a mobile electronic device. The mobile electronic device may include laptop computers, mobile phones, smartphones, tablet PCs, personal digital assistants (PDAs), enterprise digital assistants (EDAs), digital still cameras, digital video cameras, portable multimedia players (PMPs), personal navigation devices or portable navigation devices (PNDs), handheld game consoles, mobile Internet devices (MIDs), wearable computers, Internet of Things (IoT) devices, Internet of Everything (IoE) devices, or a drones.

The processor 110 is a primary component of the electronic device 100 that processes and manages instructions, and is mainly responsible for executing an operating system and applications. In addition, the processor 110 enables a workload to be distributed to multiple computing entities to be processed in parallel to solve complex work or tasks. The processor 110 is a functional block configured to execute one or more machine-executable instructions or pieces of software, firmware, or combinations thereof. The processor 110 may be implemented using hardware that performs calculations and other operations (e.g., a control operation, a configuration operation, etc.) in the electronic device 100, that is, various circuit elements and devices.

The processor 110 may be implemented as an integrated circuit (IC), a system on a chip (SoC), an application processor (AP), a mobile AP, a chipset, or a set of chips. As an example, the processor 110 may be a semiconductor device that performs a memory control function, and may include a memory controller 112. The processor 110 may further include random access memory (RAM), a central processing unit (CPU), a graphics processing unit (GPU), and/or a modem.

The memory system 120 may be configured as a functional block that performs an operation of a memory (e.g., "main memory") for the electronic device 100, and may be implemented as, for example, 5th generation LPDDR SDRAM (LPDDR5 SDRAM). The LPDDRS SDRAM may include a memory circuit, may handle access to data and instructions stored in the memory circuit, and perform other control or configuration operations. The LPDDRS SDRAM is a "dynamic" memory circuit. The dynamic memory circuit may store information (e.g., information bits, such as data, instructions, etc.) using circuit elements, such as capacitors that lose charge over time, due to leakage and/or other charge loss mechanisms. A DRAM cell including one transistor and one storage capacitor exhibits variable data retention characteristics, and prevents or reduces loss of stored information by restoring DRAM cell data by periodically performing a refresh operation.

The memory system 120 may include a plurality of memory chips 121 and 122. For example, as shown in FIG. 2, the memory chips 121 and 122 may include memory cell arrays 221 and 222, respectively, the memory cell arrays 221 and 222 may each include a plurality of bank groups BG0 to BG3 each including a plurality of banks BANK0 to BANK3, and the banks BANK0 to BANK3 may include a plurality of memory cell rows (or pages), respectively. The configuration of the memory cell arrays 221 and 222 shown in FIG. 2 does not represent or imply a limitation on the present disclosure. For example, the memory cell arrays 221 and 222 may include four bank groups according to a 16 or 8 data DQ signal configuration implemented in a single channel 130, and each bank group may include four, eight, or sixteen banks.

The memory chips 121 and 122 may include, for example, LPDDRS SDRAM, and may be logically and/or physically divided into at least two ranks. In the some example embodiments, the memory system 120 is illustrated as having a two-rank structure, but the inventive concepts are not limited thereto, and the memory system 120 may have various rank structures. In the following example embodiments, for convenience of description, the memory chip 121 may be referred to as a first rank 121 and the memory chip 122 may be referred to as a second rank 122. Also, the first and second ranks 121 and 122 and the terms RANK0 and RANK1 may be used interchangeably.

The memory controller 112 of FIG. 1A is a functional block that manages, controls, and differently handles interactions between the processor 110 and the memory system 120. For example, the memory controller 112 may perform memory access (e.g., read, write, etc.) on behalf of the processor 110, and perform configuration and control operations and/or other operations on the memory system 120. The memory controller 112 may communicate with the memory system 120 through the channel 130. As shown in FIGS. 2 and 3, the channel 130 may be implemented as a bus including clock signal lines transmitting clock signals (CK_t, CK_c, hereinafter referred to as "CK"), data clock signals (WCK_t, WCK_c, hereinafter referred to as "WCK"), and read data strobe signals (RDQS_t, RDQS_c, hereinafter referred to as "RDQS"), command/address signal lines transmitting commands/addresses (CMD/ADDR, hereinafter referred to as "CA"), and data lines transmitting data (DQ [15:0], hereinafter referred to as "DQ").

In FIG. 2, the first and second ranks 121 and 122 may share the clock signal lines CK, WCK, and RDQS, the command/address signal lines CA, and the data lines DQ of the channel 130. Each of the first and second ranks 121 and 122 may have one or more enable signals to be selected among other ranks. For example, each of the first and second ranks 121 and 122 may use a chip select signal as a select/enable signal to be distinguished from other ranks. For example, the first rank 121 may be enabled by a first chip select signal CS_Rank0, and the second rank 122 may be enabled by a second chip select signal CS_Rank1.

The memory controller 112 may control a write operation and/or a read operation of the memory system 120. As shown in FIG. 3, the memory controller 112 may control rank-to-rank (Rank2Rank) memory access to perform a write operation on the first rank 121 and then perform a read operation on the second rank 122. Referring to FIG. 3, at time point Ta, the first chip select signal CS_Rank0 and a write command WR may be applied to the first rank 121. A bank and column address designating a memory on which a write operation is to be performed may be received together with the write command WR. At time point Tb, the second chip select signal CS_Rank1 and a read command RD for the second rank 122 may be applied. A bank and column address designating a memory on which a read operation is to be performed may be received together with the read command RD.

After a write latency WL from the time point Ta, the write data DQ[15:0] of the first rank 121 may be received at time point Tc. A time between time point Ta and time point Tc corresponds to a preparation time for a memory operation of writing write data DQ[15:0] to be received in synchronization with the data clock signal WCK into memory cells corresponding to bank and column addresses. During this time, a burst address may be stored in a write pointer corresponding to a write command WR in a write FIFO of the first rank 121. From time point Tc, a write operation of writing the write data DQ[15:0] to memory cells related to the burst address output from the write FIFO may be performed.

After a read latency RL from the time point Tb, the read data DQ[15:0] of the second rank 122 may be output at the time point Td. A time between time point Tb and time point Td corresponds to a preparation time for a memory operation of reading read data DQ[15:0] to be output in synchronization with the read data strobe signal RDQS from memory cells corresponding to bank and column addresses. During this time, a corresponding burst address may be stored in a read pointer corresponding to the read command RD in a read FIFO of the second rank 122. From time point Td, an operation of reading data stored in memory cells connected to a burst address output from the read FIFO may be performed.

In a rank-to-rank timing diagram of FIG. 3, the data clock signal WCK provided from the memory controller 112 is defined to be driven after a period 210 that satisfies a tWCKENL parameter. The tWCKENL parameter is a delay time required to prepare a WCK2CK synchronization operation to cause the WCK clock to be synchronized with the CK clock by the memory controller 112. The WCK2CK synchronization operation is initialized by a CAS command and performed after the tWCKENL parameter period 210. The memory controller 112 has to start to drive the data clock signal WCK by turning off a WCK buffer according to the CAS command and turning on the WCK buffer after the tWCKENL parameter period 210. That is, the tWCKENL parameter period 210 is required for the memory controller 112 due to a rank-to-rank operation, and the tWCKENL parameter period 210 and the WCK2CK synchronization operation may cause a delay in the electronic device 100 to be a burden on a high-speed operation performance.

Also, in the rank-to-rank timing diagram of FIG. 3, a tODToff parameter period 220 is defined for the data line of the channel 130 in which the write data DQ[15:0] of the first rank 121 and the read data DQ[15:0] of the second rank 122 are loaded. The tODToff parameter is a delay time required to turn off an on die termination (ODT) circuit of the first rank 121 that receives the write data DQ[15:0]. After the tODToff parameter period 220, the read data DQ[15:0] output from the second rank 122 may be transmitted to the memory controller 112 through the data line of the channel 130. According to some example embodiments, the rank-to-rank operation may be set to perform a read operation on the first rank 121 and then a write operation on the second rank 122, and in this case, the tODToff parameter is to be switched to a tODTon parameter. The tODTon parameter is a delay time required to turn on an ODT circuit of the second rank 122 that receives the write data DQ[15:0].

The first and second ranks 121 and 122 may perform memory access to data DQ processed or to be processed by the processor 110 under control by the memory controller 112. The memory controller 112 may transmit memory operations for the first and second ranks 121 and 122 according to timing parameters determined in a DDR and/or LPDDR protocol. When the memory controller 112 transmits the memory operations for the first and second ranks 121 and 122, if data toggling is paused like the tODToff parameter period 220 and/or the tODTon parameter period, the electronic device 100 may experience an operational delay. A high-speed operation of the electronic device 100 may be affected due to the paused data toggling.

In some example embodiments, the memory controller 112 may determine that a data bubble (DQ bubble) occurs in the data line when data toggling transmitted and received in the data line of the channel 130 is paused. The data bubble may interfere with the high-speed operation of the electronic device 100. Continuous data toggling performed without a data bubble may be helpful for the high-speed operation performance of the electronic device 100.

Accordingly, the memory controller 112 may be provided to prevent or reduce delay and performance degradation of the electronic device 100 when performing a memory access operation on each of the first and second ranks 121 and 122. In addition, the memory controller 112 may be configured to cause each of the ranks 121 and 122 to selectively enter an idle power-down (IPD) or an active power-down (APD) state considering a page access pattern for each rank for power reduction and power efficiency of the electronic device 100. In addition, the memory controller 112 may determine when each of the ranks 121 and 122 is refreshed and/or a memory bank order in which refreshing is performed before each of the ranks 121 and 122 enters the IPD or APD state.

In FIG. 2, the memory controller 112 may transmit a command CMD and an address ADDR to the memory system 120 through the command/address signal lines CA of the channel 130. The command CMD may include an active command ACT (FIG. 8), a read command RD, a write command WR, a precharge command, and the like. The address ADDR may include a bank group address, a bank address, a row address, and a column address. The bank address may address a bank corresponding to the bank group address. Because the row address addresses memory cell rows of a bank corresponding to the bank address, the row address may be referred to as a memory cell row address or a page address. The column address may select data of a memory cell row activated by the row address. The active command ACT may activate a memory cell row corresponding to a row address, the read command RD and the write command WR may instruct a read operation and a write operation with respect to the activated memory cell row, and the precharge command may precharge the activated memory cell row.

The memory controller 112 may determine a page hit PH, a page miss PM, or a page collision PC for a page corresponding to a bank address and a row address provided to the memory system 120. The page hit PH may determine that a current row address and a previous row address are the same in different banks, and the page miss PM may determine that a current row address and a previous row address are not the same in different banks. The page collision PC may determine that a current row address and a previous row address are not the same in the same bank. In the case of the page collision PC, an operation of precharging a memory cell row related to the previous row address may be required. According to some example embodiments, the memory controller 112 may determine a page hit/miss/collision PC/PM/PC by comparing the current row address with a plurality of previous row addresses.

In some example embodiments, as shown in FIG. 1A, the memory controller 112 may control the first rank 121 to enter the IPD state during memory access in which a data toggle time tBGd (FIG. 8) without a data bubble is equal to or greater than an IPD minimum gain duration in an access to another bank or between different bank groups for the second rank 122. Conversely, the memory controller 112 may control the second rank 122 to enter the IPD state, during memory access in which the data toggle time tBGd without a data bubble is equal to or greater than the IPD minimum gain duration in an access to a different bank or between different bank groups for the second rank 122.

In some example embodiments, as shown in FIG. 1B, the memory controller 112 may control the first rank 121 to enter the IPD state, during memory access in which a time t(PH+PM) that is the sum of the page hit time tPH and the page miss time tPM in the second rank 122 is equal to or greater than the IPD minimum gain duration. Conversely, the memory controller 112 may control the second rank 122 to enter the IPD state, during memory access in which a time t(PH+PM) that is the sum of the page hit time tPH and the page miss time tPM in the first rank 122 is equal to or greater than the IPD minimum gain duration.

In some example embodiments, as shown in FIG. 4, the memory controller 112 may control the first rank 121 to enter the APD state during memory access in which a data toggle time tBGd without a data bubble is shorter than the IPD minimum gain duration in an access to a different bank or between different bank groups for the second rank 122. Conversely, the memory controller 112 may control the second rank 122 to enter the APD state, when there is an open page for the second memory bank during memory access in which the data toggle time tBGd without a data bubble is shorter than the IPD minimum gain duration in an access to a different bank or between different bank groups for the second rank 122.

The memory access operation for each of the first and second ranks 121 and 122 by the memory controller 112 described with reference to FIGS. 1A, 1B, and 4 and causing each of the first and second ranks 121 and 122 to selectively enter the IPD or APD state may be performed by the power-down control circuit 212 illustrated in FIG. 2. The power-down control circuit 212 may cause each of the first and second ranks 121 and 122 to enter the IPD or APD state considering a page access pattern for each memory rank. The power down control circuit 212 may include a page access aware power down control per chip (PAPCC) circuit 212 as a functional block performing page access and IPD or APD operations for each memory rank. For convenience of description, the power down control circuit 212 and the PAPCC circuit 212 may be used interchangeably.

The PAPCC circuit 212 is described below with reference to FIG. 5. In the following example embodiment, it is described that the PAPCC circuit 212 controls the IPD or APD state of each of the first and second ranks 121 and 122, but embodiments are not limited thereto. For example, the PAPCC circuit 212 may correspond to a configuration provided in the memory controller 112, and the memory controller 112 may control the IPD or APD state of each of the first and second ranks 121 and 122. Furthermore, the memory controller 112 may determine a timing at which refresh is performed and/or a memory bank order in which refresh is performed by refresh postponing, pull-in, or reordering for the corresponding rank in the IPD or APD period.

Figure 5:
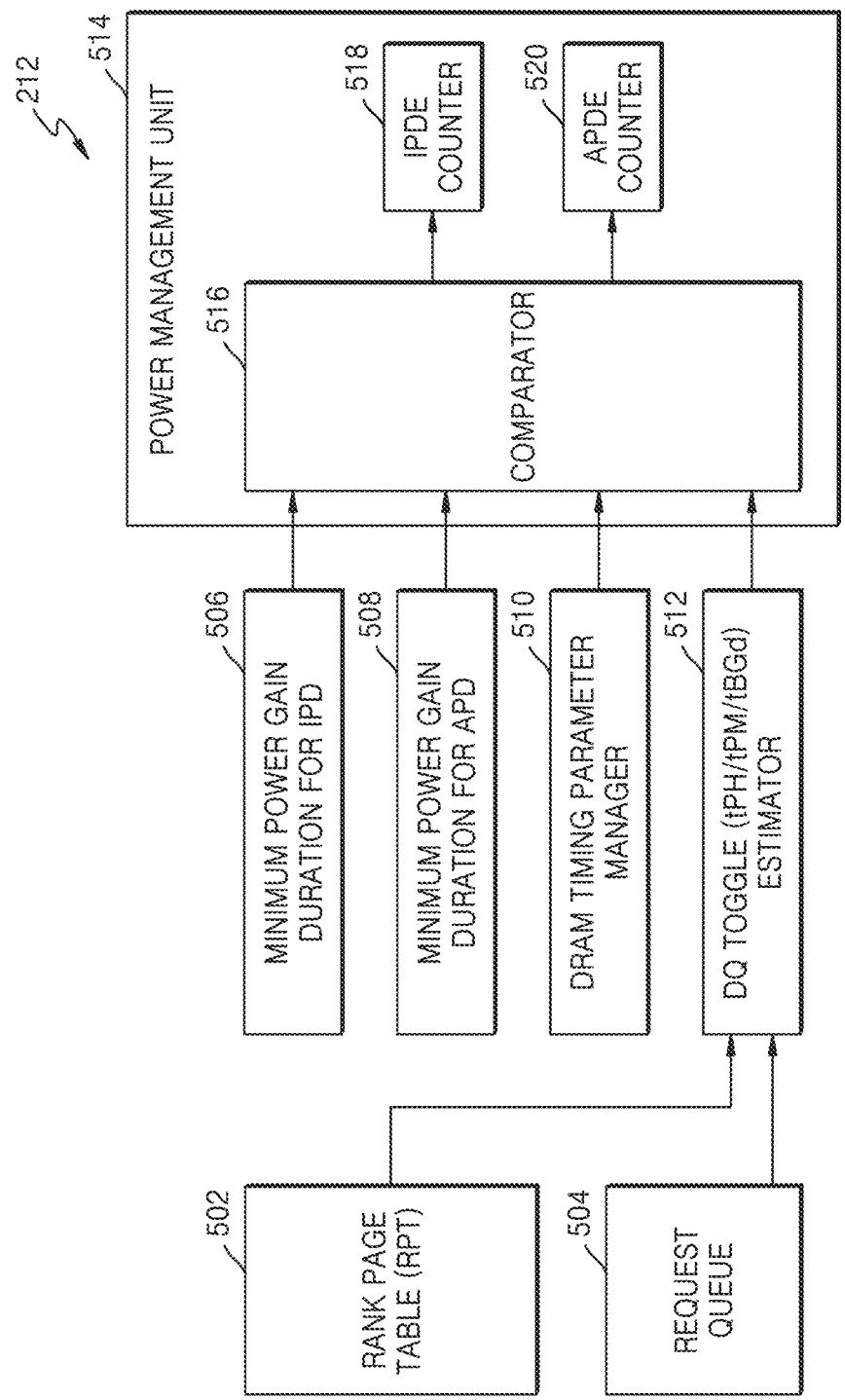
FIG. 5 is a diagram illustrating a power-down control circuit according to example embodiments.

FIG. 5 is a block diagram illustrating the PAPCC circuit 212 of FIG. 2.

Referring to FIGS. 2 and 5, the PAPCC circuit 212 may include a rank page logic circuit (or a rank page table RPT) 502, a request queue 504, an IPD minimum gain duration information storage unit (or a minimum power gain duration for IPD) 506, an APD minimum gain duration information storage unit (or a minimum power gain duration for APD) 508, a DRAM timing parameter manager 510, a data toggle estimator (or DQ toggle (tPH/tPM/tBGd) estimator) 512, and a power management unit 514. The power management unit 514 may include a comparator 516, an IPD entry (IPDE) counter 518, and an APD entry (APDE) counter 520. The PAPCC circuit 212 may be implemented exclusively in software or hardware, or may be implemented in a combination of software and hardware. When implemented in software, related program code (which may be stored in non-transitory memory) may also be implemented, and the memory controller 112 may execute program code in which an operation of the PAPCC circuit 212 is described.

The rank page logic circuit 502 may store a page status (e.g., open/close) of a bank corresponding to a memory access with respect to RANK0 121 or RANK1 122 that is to be accessed or that has been accessed.

The request queue 504 may store an occupancy flag indicating occupancy for each pending requester for RANK0 121 or RANK1 122, a schedule status, and/or page hit/miss/collision PC/PM/PC information in a rank/bank in association with the rank page logic circuit 502.

The IPD minimum gain duration information storage unit 506 may store IPD minimum gain duration information provided to indicate that it is helpful to reduce power of the memory system 120 and/or the electronic device 100 for the RANK0 121 or the RANK1 122 to enter the IPD when there is no memory access by the memory controller 112. The IPD minimum gain duration information may be provided as one of device information of the memory system 120. The device information of the memory system 120 may include initial information, such as a vendor, a process, a shape, a configuration, a storage capacity, and an execution environment of the memory system 120.

As an example, the IPD minimum gain duration may include the sum of a rank-to-rank switching time to a (tRFCpb×2+tCSPD+tCSH+tXP+tRCD) time. The tRFCpb time represents a per-bank refresh cycle time, the tCSPD time represents a delay time from power-down entry to a transition of the chip select signal CS to logic high, the tCSH time represents a time that is a minimum high pulse period of the chip select signal CS at the time of power-down exit, the tXP time represents a delay time from power-down exit to a next valid command, and the tRCD time represents a RAS-to-CAS delay time. The tRCD time refers to a delay time from issuance of an active command to application of a write/read (WR/RD) command.

The APD minimum gain duration information storage unit 508 may store APD minimum gain duration information provided to indicate that it is helpful to reduce power of the memory system 120 and/or the electronic device 100 for the RANK0 121 or the RANK1 122 to enter the APD when there is no memory access by the memory controller 112. The APD minimum gain duration information may be selectively provided as one of device information of the memory system 120.

The DRAM timing parameter manager 510 may control operation timings of the RANK0 121 and the RANK1 122 based on timing parameters conforming to the Joint Electron Device Engineering Council (JEDEC) standard.

The data toggle estimator 512 may estimate a page hit processing time tPH, a page miss processing time tPM, and/or a data toggle time tBGd without a data bubble of a corresponding rank 121 or 122 based on page status information for each bank of the RANK0 121 or RANK1 122 in association with the rank page logic circuit 502 and/or the request queue 504.

As an example, the page hit processing time tPH may refer to a time required to process a memory access to a bank in which the page hit PH occurs (e.g., a page-hit bank), and each bank may have a plurality of page hits. The page miss processing time tPM may refer to a time required to process a memory access to a bank in which the page miss PM occurs (e.g., a page-missed bank), and may include a (tPM_RCD+tPM_RRD) time. The tPM_RCD time refers to a delay time from issuance of the active command ACT to the application of the write/read (WR/RD) command for the page-missed bank, and the tPM_RRD time refers to a minimum delay time between active commands ACT for different banks.

The power management unit 514 may determine entry to the IPD or APD for the RANK0 121 or the RANK1 122 in association with the IPD minimum gain duration information storage unit 506, the APD minimum gain duration information storage unit 508, the DRAM timing parameter manager 510 and/or the data toggle estimator 512. The RANK0 121 or the RANK1 122 entering the IPD state may consume a IDD2P parameter current less than an IDD2N parameter current, and the RANK0 121 or the RANK1 122 entering the APD state may consume an IDD3P parameter current less than an IDD3N parameter current.

The comparator 516 of the power management unit 514 may compare a time (tPH+tPM) that is the sum of the page hit processing time tPH and the page miss processing time tPM in the RANK1 122 estimated by the data toggle estimator 512 with the IPD minimum gain duration from the IPD minimum gain duration information storage unit 506. As a result of comparison, if the page hit and page miss processing time (tPH+tPM) in the RANK1 122 is equal to or greater than the IPD minimum gain duration, the memory controller 112 may determine that there is no or little possibility of performing a memory access to the RANK0 121 because it will take a relatively long time to process the memory access. Accordingly, the memory controller 112 may perform IPD entry of the RANK0 121.

In some example embodiments, the comparator 516 may compare the data toggle time tBGd without a data bubble in the memory access to the RANK1 122 estimated by the data toggle estimator 512 with the IPD minimum gain duration. As a result of comparison, if the data toggle time tBGd without a data bubble in the memory access to the RANK1 122 is greater than the IPD minimum gain duration, the memory controller 112 may determine that there is relatively no or little possibility of performing a memory access to the RANK0 121 because it will be continuous without a data bubble to process the memory access to the RANK1 122. Accordingly, the memory controller 112 may perform IPD entry of the RANK0 121.

In some example embodiments, the comparator 516 may compare the page hit processing time tPH in the RANK0 121 estimated by the data toggle estimator 512 with a time tRCD+RL that is the sum of tRCD and read latency RL time provided from the DRAM timing parameter manager 510.

As a result of comparison, if the page hit processing time tPH in the RANK0 121 is equal to or greater than the sum tRCD+RL of tRCD and read latency RL time, the memory controller 112 may determine that banks more than necessary in RANK0 121 are open. Accordingly, there it would be beneficial for a method of reducing power consumption in the RANK0 121 by opening only a minimum number of banks during the page hit processing time tPH within a limit in which a data bubble does not occur.

In some example embodiments, the comparator 516 may compare the page hit processing time tPH when a page is closed at the RANK0 121 estimated by the data toggle estimator 512 with a time tRCD+RL that is the sum of tRCD and the read latency RL time. As a result of comparison, if the page hit processing time tPH when a page is closed at the RANK0 121 is shorter than the sum tRCD+RL of tRCD and the read latency RL time, the memory controller 112 may determine that there is no open bank greater than necessary during the page hit processing time tPH in the RANK0 121 and perform APD entry of RANK0 121.

The comparator 516 may determine whether the data toggle time tBGd without a data bubble in the memory access to the RANK1 122 estimated by the data toggle estimator 512 is between an APD minimum gain duration of the APD minimum gain duration information storage unit 508 and an IPD minimum gain duration. As a result of the determination, if the data toggle time tBGd without a data bubble in the memory access to the RANK1 122 is between the APD minimum gain duration and the IPD minimum gain duration, the memory controller 112 may determine that it is helpful for power and performance of the electronic device 100 for the RANK0 121 to enter APD, and cause the RANK0 121 to enter APD.

As described above, before determining entry into the IPD or APD state for RANK0 121 or RANK1 122, the memory controller 112 may wait for downcounting using an IPDE counter 518 or an APDE counter 520. The IPDE counter 518 may store a first count value and wait for the IPD entry, while downcounting the first count value. The first count value may be set as a waiting time for preparing for a possibility of an access request to the RANK0 121 or the RANK1 122 before entering the IPD state. The APDE counter 520 may store a second count value and wait for the APD entry, while downcounting the second count value. The second count value may be set as a waiting time for preparing for the possibility of an access request to the RANK0 121 or the RANK1 122 before APD entry. As an example, if an access request is received when the downcounting of the IPDE counter 518 for the RANK0 121 is not finished, the memory controller 112 may block the IPD entry of the RANK0 121. If an access request is received when the downcounting of the APDE counter 520 for the RANK0 121 is not finished, the memory controller 112 may block the APD entry of the RANK0 121. The first count value of the IPDE counter 518 and the second count value of the APDE counter 520 may be set to the same value or different values.

FIG. 6 is a diagram illustrating the rank page logic circuit 502 of FIG. 5.

Referring to FIGS. 2, 5, and 6, the rank page logic circuit 502 may include a rank page table RPT configured to indicate a page status in banks BANK0 to BANKN−1 (N may be, for example, 4, 8, or 16) of each of the RANK0 121 and RANK1 122. The rank page table RPT may be implemented as registers (or storage elements) that store a page status in each of the banks BANK0 to BANKN−1 of the RANK0 121 and the RANK1 122.

The memory controller 112 may perform a memory access to the RANK0 121 or the RANK1 122 and store a page status of the banks BANK0 to BANKN-1 corresponding to a memory access of the corresponding ranks 121 and 122, in the rank page table RPT, as page open, for example. In addition, in conjunction with the DRAM timing parameter manager 510 and/or the data toggle estimator 512, the memory controller 112 may selectively change the page status of the banks BANK0 to BANKN-1 stored in the rank page table RPT from page open to page close and store the page close. For example, when a page collision occurs with respect to a page corresponding to a memory access to be performed, the memory controller 112 may close the corresponding page. In addition, even when a page collision does not occur, a page in which a page collision is expected in the future may be closed in advance.

FIG. 7 is a view illustrating the request queue 504 of FIG. 5.

Referring to FIGS. 2, 5, and 7, the request queue 504 may include a request (or memory request) entry to be processed by the memory controller 112 provided from the processor 110 (FIG. 1A). The request queue 504 may store a pending request for the RANK0 121 or the RANK1 122. Each request entry may be implemented as registers (or storage elements) storing an occupancy flag indicating occupancy for first and second ranks 121 and 122 corresponding thereto, a schedule status of a request, and/or page hit/miss/collision PH/PM/PC information in a rank/bank in association with the rank page logic circuit 502.

Figure 8:
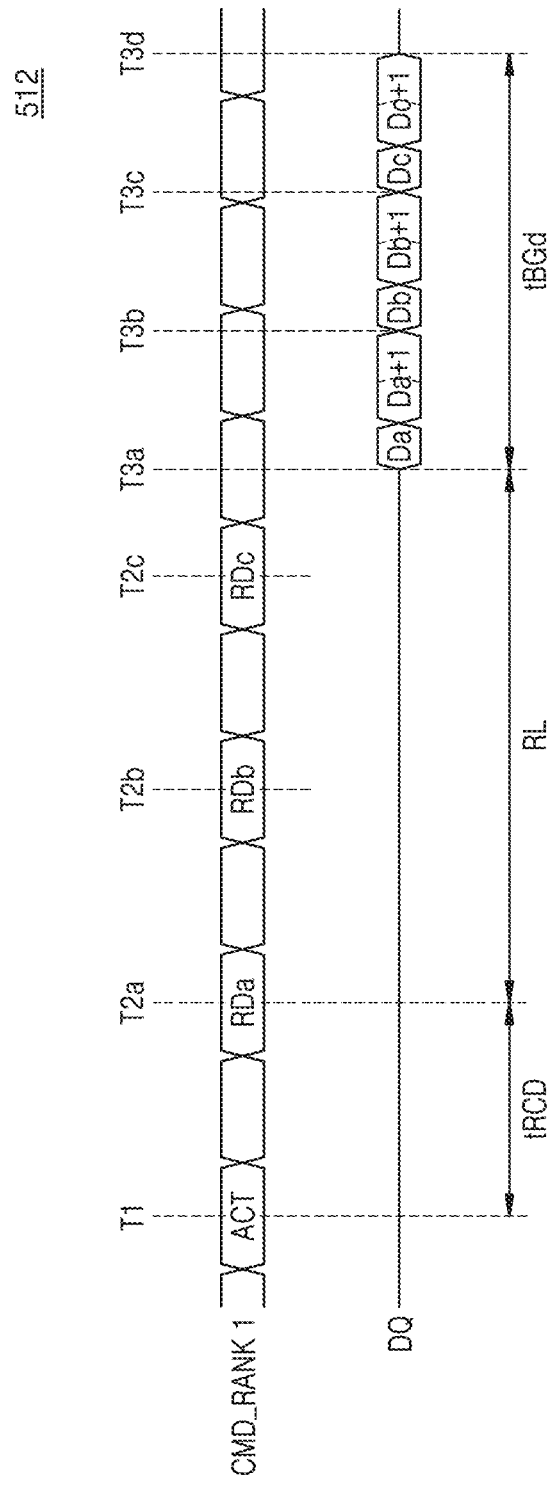
FIG. 8 is a view illustrating a data toggle estimator of FIG. 5.

FIG. 8 is a diagram illustrating the data toggle estimator 512 of FIG. 5.

Referring to FIG. 8, the data toggle estimator 512 may estimate a processing time related to a memory access to the RANK0 121 or the RANK1 122, and an example of estimating a data toggle time tBGd without a data bubble in access between different bank groups of the RANK1 122 is shown. For memory access to the RANK1 122, an active command ACT may be applied at time point T1 and a read command RDa for a first bank group may be applied at time point T2a. After a read latency RL from time point T2a, read data Da and Da+1 of the first bank group having a certain burst length may be output to the data DQ line of the channel 130 at time point T3a.

The memory controller 112 may calculate a memory access operation of outputting read data Db and Db+1 of a second bank group at time point T3b and outputting read data Dc and Dc+1 of a third bank group at time point T3c, sequentially following the read data Da and Da+1 of the first bank group at time point T3a to prevent or reduce the occurrence of a data bubble at which data DQ output is paused on the data DQ line. Accordingly, the memory controller 112 may perform scheduling or control to apply a read command RDb of the second bank group at time point T2b and apply a read command RDb of a third bank group at time point T2c, after applying the read command Rda of the first bank group at time point T2a. The memory controller 112 may estimate the data toggle time tBGd without a data bubble from time point T3a to time point T3d by using the data toggle estimator 512.

In some example embodiments, the data toggle estimator 512 may estimate a page hit processing time tPH, a page miss processing time tPM and/or a tPH+tPM time in the RANK0 121 or the RANK1 122. Also, the data toggle estimator 512 may estimate a change in the page hit processing time tPH when any one page is closed at the RANK0 121 or the RANK1 122.

Figure 9:
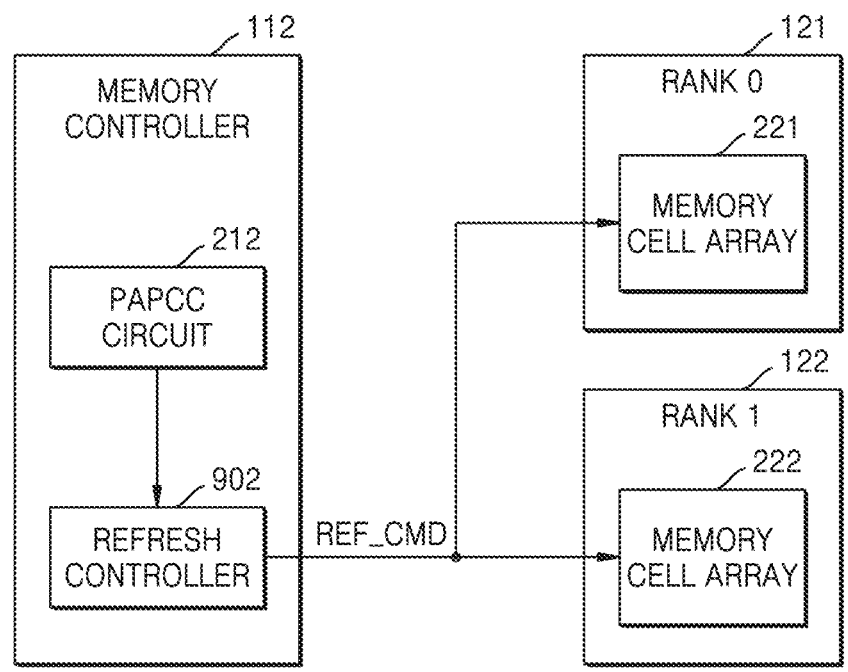
FIG. 9 is a view illustrating a memory controller according to example embodiments.
Figure 10A:
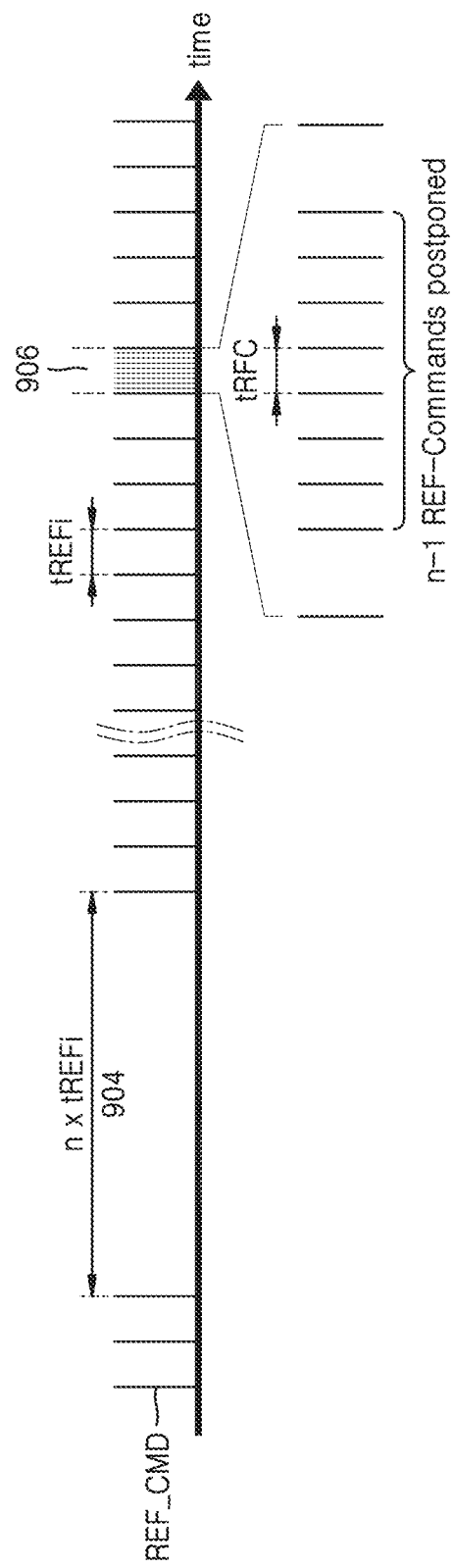

FIG. 9 is a view illustrating the memory controller 112 according to example embodiments. FIGS. 10A and 10B are diagrams illustrating refresh operations performed by a refresh controller 902 of FIG. 9. The memory controller 112 of FIG. 9 is different from that of FIG. 2 in that the memory controller 112 of FIG. 9 further includes the refresh controller 902. Hereinafter, descriptions of the memory system 120 which are the same as those of FIG. 2 are omitted.

Referring to FIGS. 2, 5, and 9, the memory controller 112 may control refresh operations of the RANK0 121 and the RANK1 122. The RANK0 121 and the RANK1 122 may refresh memory cell rows of the memory cell arrays 221 and 222, in response to a periodically applied refresh command REF_CMD. The RANK0 121 and the RANK1 122 may refresh DRAM cells by reading and restoring all memory cell rows of the memory cell arrays 221 and 222 at a regularly given refresh rate tREF. A basic refresh rate tREFi may be requested by the number of refresh commands REF_CMD of, for example, the degree of 8K within a 32-ms refresh window.

The RANK0 121 and the RANK1 122 may expect that the refresh command REF_CMD is regularly applied at every basic refresh rate tREFi. If the RANK0 121 and/or the RANK1 122 is in a power-down state, the RANK0 121 and/or the RANK1 122 may exit power-down at every basic refresh rate tREFi and perform the refresh operation. However, in order to improve scheduling and/or switching efficiency between memory accesses using the PAPCC circuit 212, the memory controller 112 may determine a timing at which refresh is performed by postponing, pull-in, or reordering some refresh commands for the RANK0 121 or the RANK1 122 and/or a memory bank order in which refresh is performed, and issue a refresh command REF_CMD according to the refresh bank order.

Before the RANK0 121 or the RANK1 122 enters the IPD or APD state by the PAPCC circuit 212, the memory controller 112 may determine a refresh bank order by refresh postponing or pull-in of the corresponding ranks 121 and 122 using the refresh controller 902 and refresh the corresponding ranks 121 and 122 using the refresh bank order. As illustrated in FIG. 10A, the memory controller 112 may skip the refresh command REF_CMD during a postpone refresh period 904 for the RANK0 121 or the RANK1 122. The skipped refresh command REF_CMD may be referred to as a postponed refresh command REF_CMD. As an example, the postpone refresh period 904 may be set to be greater than the IPD minimum gain duration stored in the IPD minimum gain duration information storage unit 506 or the APD minimum gain duration stored in the APD minimum gain duration information storage section 508.

Referring to FIG. 10A, the refresh controller 902 may count the number (n−1, in which n is a natural number) of refresh commands REF_CMD postponed during the postpone refresh period 904 of the RANK0 121 or the RANK1 122. The refresh controller 902 may issue (n−1) postponed refresh commands as (n−1) refresh commands REF_CMD during a basic refresh rate 906 applied later. That is, the memory cell rows of the corresponding ranks 121 and 122 may be refreshed at every refresh cycle tRFC in response to (n−1) refresh commands REF_CMD applied during the basic refresh rate 906. As such, in some example embodiments, a same number of refresh commands REF_CMD may be issued over a time period including a postpone refresh period 904 as a time period not including a postpone refresh period 904.

Meanwhile, the power management unit 514 may determine that the postpone refresh period 904 of the RANK0

121 or the RANK1 122 is shorter than the IPD minimum gain duration stored in the IPD minimum gain duration information storage unit 506, and block the RANK0 121 and the RANK1 122 from entering the IPD state. In addition, the refresh controller 902 may determine that the postpone refresh period 904 of the RANK0 121 or the RANK1 122 is shorter than the APD minimum gain duration stored in the APD minimum gain duration information storage unit 508, and block the RANK0 121 and the RANK1 122 from entering the APD state.

According to some example embodiments, the memory controller 112 may monitor a temperature of the memory system 120. Because the DRAM cell exhibits variable data retention characteristics according to temperatures, the memory controller 112 may set the refresh rate tREF to be short when the temperature is high, and set the refresh rate tREF to be long when the temperature is low. The memory controller 112 may determine that the temperature of the RANK0 121 or the RANK1 122 is high, and block the RANK0 121 and the RANK1 122 from entering the IPD and/or APD state.

In addition, the memory controller 112 may pull in some refresh commands REF_CMD for the RANK0 121 or the RANK1 122 to improve scheduling and/or switching efficiency between memory accesses using the PAPCC circuit 212. As illustrated in FIG. 10B, the refresh controller 902 may count the number (n−1) of refresh commands REF_CMD pulled in during the basic refresh period 908. The refresh controller 902 may refresh the memory cell rows of the RANK0 121 or the RANK1 122 at every refresh cycle tRFC in response to the (n−1) refresh commands REF_CMD applied during the basic refresh rate 908. The (n−1) refresh commands pulled in during the basic refresh period 908 may be skipped later during an n*tREFi refresh period 910.

In some example embodiments, the memory controller 112 may perform pull-in refresh on the RANK0 121 or the RANK1 122 during a memory training operation period for the RANK0 121 or the RANK1 122. The memory training operation includes parameters related to an interface between the memory controller 112 and the RANK0 121 or the RANK1 122, for example, interface tuning tasks for clock training, address/command training, write/read leveling, write/read deskew, write/read centering, reference voltage training, and the like. After the interface tuning operation is completed, the memory controller 112 may perform a data write/read operation on the RANK0 121 or the RANK1 122.

In some example embodiments, the memory controller 112 may further include a memory PHY coupled with the channel 130. The memory PHY may include a physical or electrical layer and a logical layer provided for signals, frequency, timing, driving, detailed operating parameters, and functionality required for efficient communication between the memory controller 112 and the memory system 120. The memory PHY may support features of the DDR and/or LPDDR protocol of the JEDEC standard. The memory controller 112 may perform pull-in refresh on the RANK0 121 and the RANK1 122 during a delay locked loop (DLL) update of the memory PHY.

In some example embodiments, the memory controller 112 may perform pull-in refresh on the RANK0 121 or the RANK1 122 when a read operation and a write operation are switched in each of the RANK0 121 and the RANK1 122. The memory controller 112 may perform pull-in refresh on the RANK0 121 and the RANK1 122 in a period in which ranks in which a read operation or a write operation is performed are switched. In addition, the memory controller 112 may perform pull-in refresh on the RANK0 121 or the RANK1 122 during a delay time due to a page miss/collision PM/PC in the RANK0 121 or the RANK1 122, respectively.

In some example embodiments, the memory controller 112 may reorder a refresh bank order of the RANK0 121 or the RANK1 122 using the refresh controller 902 before the RANK0 121 or the RANK1 122 enters the IPD or the APD state by the PAPCC circuit 212. The refresh controller 902 may refresh the RANK0 121 or the RANK1 122 to first refresh a bank in the tRC parameter period in the RANK0 121 or the RANK1 122 in the IPD or APD period. The tRC parameter refers to a minimum time interval between active commands in the same bank. The refresh controller 902 may reorder the bank refresh order of the RANK0 121 or the RANK1 122 to reduce refresh overhead for a bank waiting in the request queue 504 when refresh is performed on each bank in each of the RANK0 121 and the RANK1 122. In addition, the refresh controller 902 may reorder the refresh bank order so that a collision situation in which the same bank is simultaneously (e.g., at or about the same time) accessed by a refresh command and a read/write command does not occur when each bank is accessed in the RANK0 121 or the RANK1 122.

Figure 11:
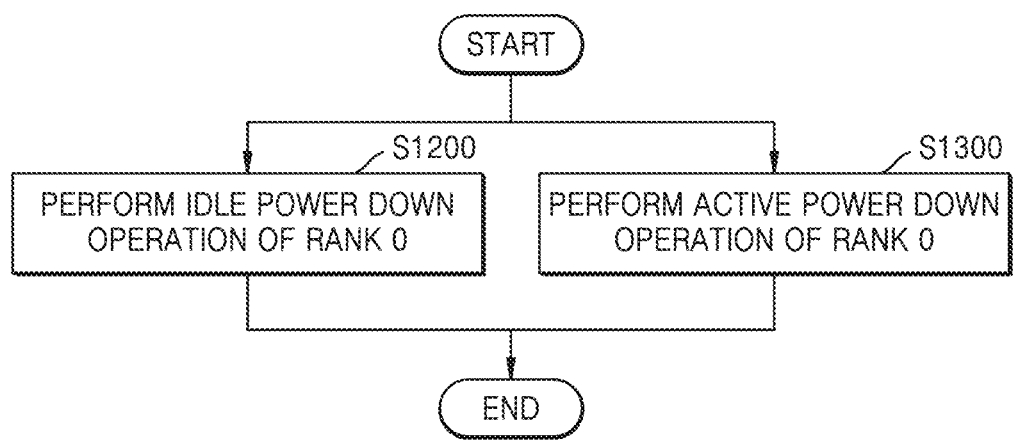
FIG. 11 is a diagram illustrating an operation of a memory controller according to example embodiments.
Figure 12:
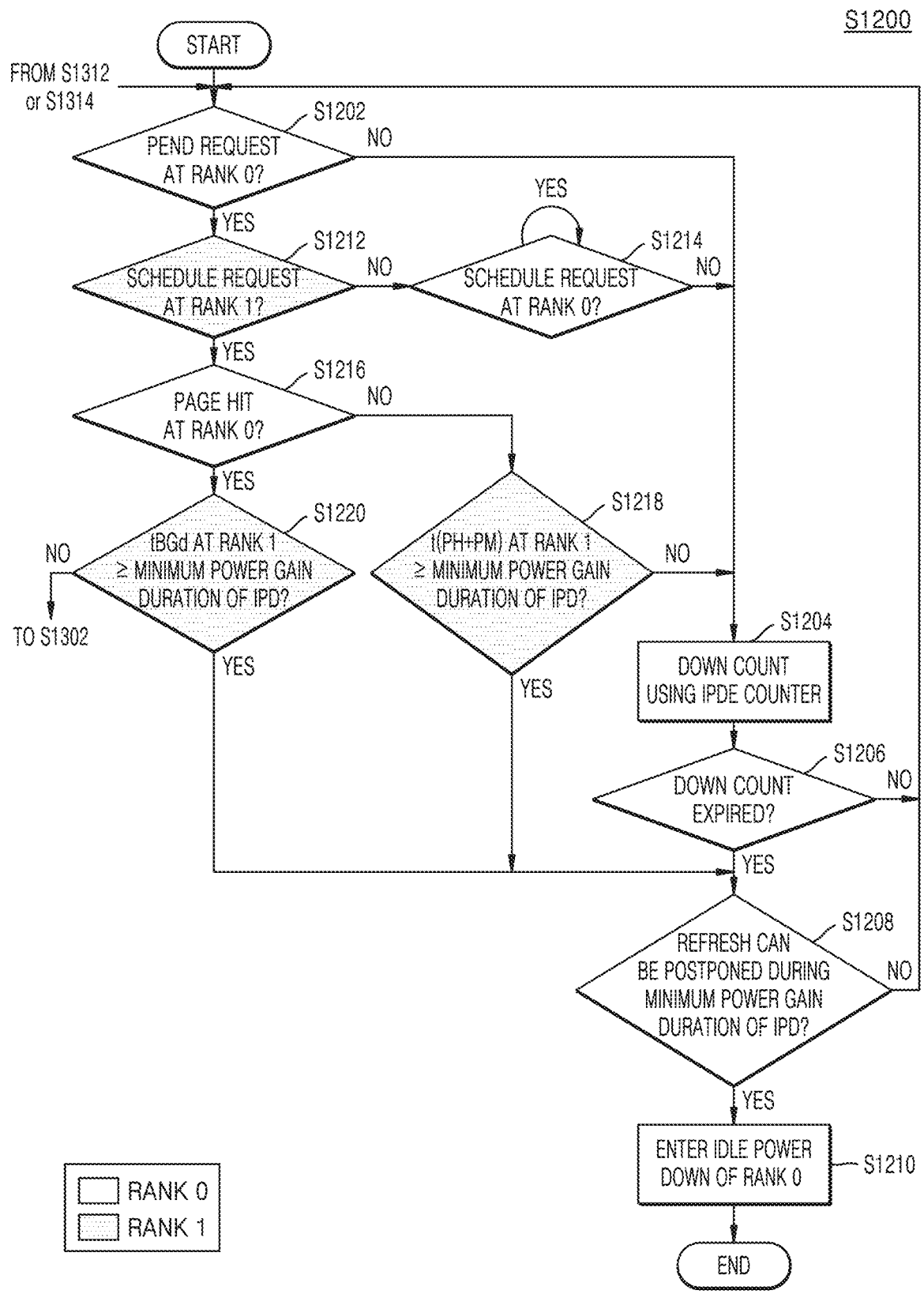
FIG. 12 is a flowchart illustrating an idle power down (IPD) entry operation of FIG. 11.
Figure 13:
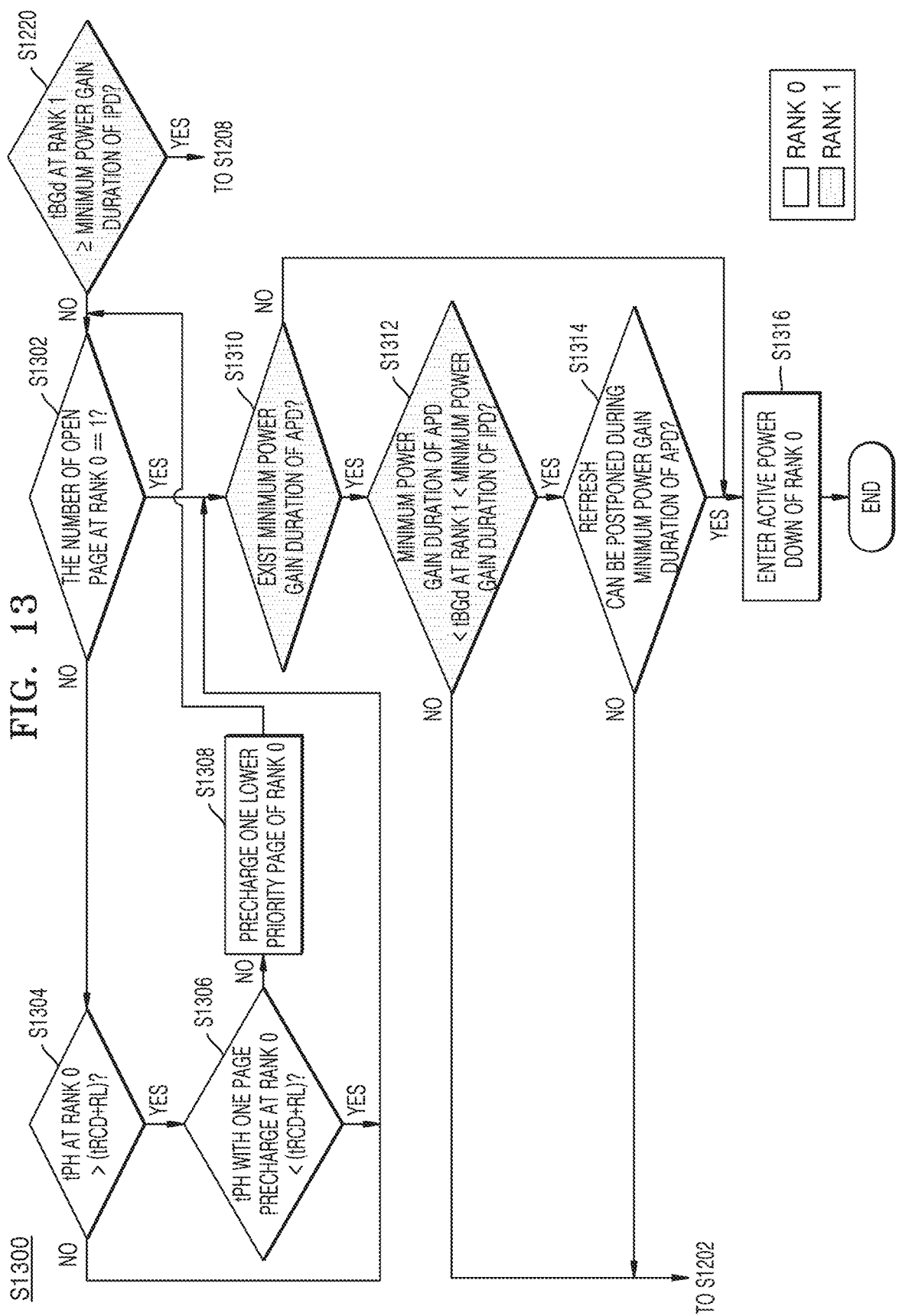
FIG. 13 is a flowchart illustrating an active power down (APD) entry operation of FIG. 11.

FIGS. 11 to 13 are diagrams illustrating an operation of a memory controller according to example embodiments. FIG. 12 is a flowchart illustrating an IPD entry operation (S1200) of the RANK0 121 of FIG. 11, and FIG. 13 is a flowchart illustrating an APD entry operation (S1300) of the RANK0 121 of FIG. 11. The IPD entry operation (S1200) and the APD entry operation (S1300) of the RANK0 121 described with reference to FIGS. 11 to 13 may be equally applied to the RANK1 122.

Referring to FIG. 11, the memory controller 112 may perform an operation of controlling the RANK0 121 to enter an IPD state in operation S1200. Operation S1200 will be specifically described with reference to FIG. 12 in connection with FIGS. 1A to 10. The memory controller 112 may perform an operation of controlling the RANK0 121 to enter an APD state in operation S1300. Operation S1300 is described with reference to FIG. 13 in connection with FIGS. 1A to 10.

Referring to FIG. 12, in operation S1202, the memory controller 112 may determine whether there is a pending request at the RANK0 121. The memory controller 112 may detect the waiting RANK0 121 using the request queue 504. As a result of the determination in operation S1202, if there is no request for the waiting RANK0 121 (NO), the memory controller 112 may determine that the current RANK0 121 is in an idle state and may proceed to operation S1204.

In operation S1204, the memory controller 112 may count down using the IPDE counter 518. In operation S1206, the memory controller 112 may determine whether the downcounting of the IPDE counter 518 is finished. If the downcounting of the first count value of the IPDE counter 518 is not finished (NO), the process may proceed to operation S1202. The memory controller 112 may need to wait to determine whether to cause the RANK0 121 to enter the IDE state. If there is a pending request at the RANK0 121 before the downcounting of the IPDE counter 518 is not finished in operation S1206, the memory controller 112 may block the RANK0 121 from entering the IPD state.

In operation S1206, when the downcounting of the IPDE counter 518 is finished (YES), the memory controller 112 may proceed to operation S1208. In operation S1208, the memory controller 112 may determine whether a refresh operation for the RANK0 121 may be postponed before the RANK0 121 enters the IPD. If the refresh operation for the RANK0 121 cannot be postponed (NO), the memory controller 112 may proceed to operation S1202.

In operation S1208, if the refresh operation for RANK0 121 may be postponed (YES), the memory controller 112 may proceed to operation S1210 to cause the RANK0 121 to enter the IPD.

As a result of the determination in operation S1202, if there is a pending request at the RANK0 121 (YES), the memory controller 112 may proceed to operation S1212. In operation S1212, the memory controller 112 may determine whether a request for the RANK1 122 is scheduled using the request queue 504. If the request for the RANK1 122 is not scheduled (NO), the memory controller 112 may proceed to operation S1214.

In operation S1214, the memory controller 112 may determine whether a request for the RANK0 121 is scheduled using the request queue 504. If the request for the RANK0 121 is scheduled (YES), the memory controller 112 may continue to schedule the request for the RANK0 121 waiting in the request queue 504. If the request for RANK0 121 is not scheduled (NO), the memory controller 112 may proceed to operation S1204, and then count down for the RANK0 121 using the IPDE counter 518 in operations S1204 and S1206, refresh postpone for the RANK0 121 in operation S1208, and perform IPD entry of the RANK0 121 in operation S1210.

In operation S1212, if the memory controller 112 schedules a request for the RANK1 122 using the request queue 504 (YES), the memory controller 112 may proceed to operation S1216. In operation S1216, the memory controller 112 may determine whether a page hit PH is performed in the RANK0 121 using the rank page logic circuit 502. If there is no page hit PH of the RANK0 121 in the rank page logic circuit 502 (NO), the memory controller 112 may proceed to operation S1218.

In operation S1218, the memory controller 112 may determine whether a tPH+tPM time that is the sum of a page hit time tPH and a miss time tPM in the RANK1 122 is greater than the IPD minimum gain duration. The IPD minimum gain duration may be provided by the IPD minimum gain duration information storage unit 506. If the tPH+tPM time in the RANK1 122 is greater than the IPD minimum gain duration (YES), the memory controller 112 may proceed to operation S1208. The fact that the tPH+tPM time in the RANK1 122 is greater than the IPD minimum gain duration means that there is no or little possibility of performing a memory access to the RANK0 121 because it will take a relatively long time to process the memory access. Accordingly, the memory controller 112 may proceed to operation S1208 to determine whether refresh can be postponed on the RANK0 121 and enter IPD of the RANK0 121 in operation S1210.

If the tPH+tPM time in the RANK1 122 is shorter than the IPD minimum gain duration (NO) in operation S1218, the memory controller 112 may proceed to operation S1204. The fact that the tPH+tPM time in RANK1 122 is shorter than the IPD minimum gain duration means that a possibility of performing a memory access is relatively high because it will take a relatively short time to process the memory access to the RANK1 122. Accordingly, the memory controller 112 may proceed to operation S1204 and need to wait to determine whether to cause the RANK0 121 to enter the IDE state. Thereafter, the memory controller 112 may count down for the RANK0 121 using the IPDE counter 518 in operations S1204 and S1206, refresh postpone for the RANK0 121 in operation S1208, and perform IPD entry of the RANK0 121 in operation S1210.

In operation S1216, if there is a page hit PH at the RANK0 121 in the rank page logic circuit 502 (YES), the memory controller 112 may proceed to operation S1220. In operation S1220, the memory controller 112 may determine whether the data toggle time (tBGd, FIG. 8) without a data bubble in another bank access to the RANK1 122 is greater than the IPD minimum gain duration using the data toggle estimator 512. If the tBGd time for the RANK1 122 is greater than the IPD minimum gain duration (YES), the memory controller 112 may proceed to operation S1208. The fact that the tBGd time for the RANK1 122 is greater than the IPD minimum gain duration in operation S1220 means that there is relatively no or little possibility of performing a memory access to the RANK0 121 because it will be continuous without a data bubble to process the memory access to the RANK1 122. Accordingly, the memory controller 112 may proceed to operation S1208 to determine whether refresh can be postponed for the RANK0 121, and cause the RANK0 121 to enter the IPD in operation S1210.

In operation S1220, if the tBGd time in the RANK1 122 is shorter than the IPD minimum gain duration (NO), the memory controller 112 may proceed to operation S1302 of FIG. 13. The fact that the tBGd time for the RANK1 122 is shorter than the IPD minimum gain duration means that a possibility of performing a memory access is relatively high because it will take a relatively short time to process the memory access to the RANK1 122.

Referring to FIG. 13, in operation S1302, the memory controller 112 may determine whether the number of open pages is 1 for the RANK0 121 stored in the rank page logic circuit 502. If the number of open pages for the RANK0 121 is 1 (YES), the memory controller 112 may proceed to operation S1310.

In operation S1310, the memory controller 112 may determine whether APD minimum gain duration information is provided from the APD minimum gain duration information storage unit 508. If the APD minimum gain duration information is not provided (NO), the memory controller 112 may proceed to operation S1316. In operation S1316, the memory controller 112 may cause the RANK0 121 to enter the APD.

In operation S1310, if the APD minimum gain duration information is provided from the APD minimum gain duration information storage unit 508 (YES), the memory controller 112 may proceed to operation S1312. In operation S1312, the memory controller 112 may determine whether the tBGd time for the RANK1 122 is greater than the APD minimum gain duration and shorter than the IPD minimum gain duration using the data toggle estimator 512. That is, in operation S1312, it may be determined whether the tBGd time for the RANK1 122 is between the APD minimum gain duration and the IPD minimum gain duration. If the tBGd time for the RANK1 122 is between the APD minimum gain duration and the IPD minimum gain duration (YES), the memory controller 112 may determine that it is helpful for power and performance of the electronic device 100 for the RANK0 121 to enter APD and may proceed to operation S1314.

In operation S1314, the memory controller 112 may determine whether a refresh operation for the RANK0 121 may be postponed before the RANK0 121 enters the APD. If the refresh operation for the RANK0 121 cannot be postponed (NO), the memory controller 112 may proceed to operation S1202.

In operation S1314, if the refresh operation for RANK0 121 can be postponed (YES), the memory controller 112 may proceed to operation S1316 to cause the RANK0 121 to enter the APD.

In operation S1312, if the data toggle time tBGd of another bank without a data bubble in the memory access to the RANK1 122 is not between the APD minimum gain duration and the IPD minimum gain duration (NO), the memory controller 112 may determine that it is not helpful for power and performance of the electronic device 100 for the RANK0 121 to enter APD and may proceed to operation S1302.

In operation S1302, if the number of open pages at the RANK0 121 stored in the rank page logic circuit 502 is not 1 (NO), the memory controller 112 may proceed to operation S1304. In operation S1304, the memory controller 112 may determine whether the page hit processing time tPH in the RANK0 121 is greater than the sum of the tRCD timing parameter time and the read latency RL time, that is, tRCD+RL time using the data toggle estimator 512.

In operation S1304, if the page hit processing time tPH at the RANK0 121 is not greater than the tRCD+RL time (NO), the memory controller 112 may proceed to operation S1310. The fact that the page hit processing time tPH at the RANK0 121 is not greater than the tRCD+RL time means that the number of banks that are open in an active state to process a page hit memory access for the RANK0 121 and that consumes power of the RANK0 121 when entering APD is minimized. Accordingly, the memory controller 112 may proceed to operation S1310 to determine whether to enter the APD state. The memory controller 112 may determine an APD minimum gain duration information for the RANK1 122 in operation S1310, may determine whether the data toggle time tBGd without a data bubble is between the APD minimum gain duration and the IPD minimum gain duration in another bank access for the RANK1 122 in operation S1312, may determine whether refresh can be postponed for the RANK0 121 in operation S1314, and may enter APD of the RANK0 121 in operation S1316.

In operation S1304, if the page hit processing time tPH in the RANK0 121 is greater than tRCD+RL time (YES), the memory controller 112 may proceed to operation S1306. The fact that the page hit processing time tPH in the RANK0 121 is greater than tRCD+RL time means that the number of open banks in an active state for page hit processing is more than necessary (e.g., to allow for a successful page hit), so that power of the RANK0 121 is unnecessarily or, alternatively, undesirably consumed if entering APD.

In operation S1306, the memory controller 112 may determine whether the page hit processing time tPH when one page is closed at the RANK0 121 is shorter than the tRCD+RL time. If the page hit processing time tPH when one page is closed at the RANK0 121 is shorter than the tRCD+RL time (YES), the memory controller 112 may proceed to operation S1310. Closing any one page means precharging the page, and the fact that the page hit processing time tPH when any one page is closed at the RANK0 121 is shorter than the tRCD+RL time means that the number of banks open in an active state for page hit processing is reduced so that power consumption of the RANK0 121 when entering the APD is also reduced. Accordingly, the memory controller 112 may proceed to operation S1310 to determine whether to enter the APD state. The memory controller 112 may determine an APD minimum gain duration information for the RANK1 122 in operation S1310, may determine whether the data toggle time tBGd without a data bubble is between the APD minimum gain duration and the IPD minimum gain duration in another bank access for the RANK1 122 in operation S1312, may determine whether refresh can be postponed for the RANK0 121 in operation S1314, and may enter APD of the RANK0 121 in operation S1316.

In operation S1306, if the page hit processing time tPH when any one page is closed at the RANK0 121 is not shorter than the tRCD+RL time (NO), the memory controller 112 may proceed to operation S1308. The fact that the page hit processing time tPH when any one page is closed at the RANK0 121 is not shorter than tRCD+RL time means that the number of open banks in an active state for page hit processing is not reduced, so that power consumption of the RANK0 121 when entering APD is not reduced. To prevent or reduce this, the memory controller 112 closes one lower priority page during scheduling of the RANK0 121 in operation S1308 to reduce the number of open banks in an active state, and may proceed to operation S1302. Thereafter, by repeating operations S1302, S1304, S1306, and S1308, the memory controller 112 reduces the number of open banks in an active state before entering the APD to induce power consumption of the RANK0 121 to be reduced when entering the APD.

Figure 14:
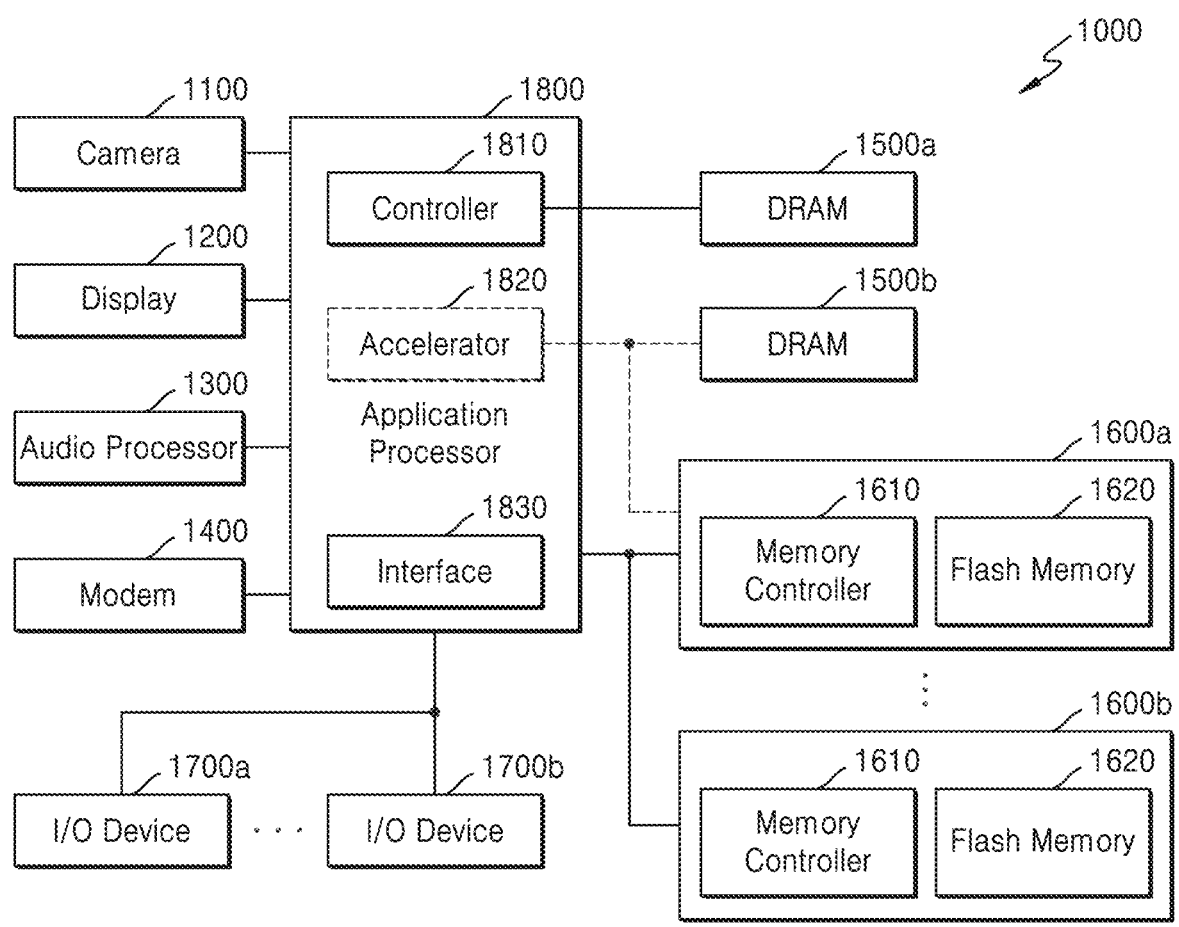
FIG. 14 is a block diagram illustrating a system including a memory controller according to example embodiments.

FIG. 14 is a block diagram illustrating a system 1000 to which a power-down method according to example embodiments is applied.

Referring to FIG. 14, the system 1000 may include a camera 1100, a display 1200, an audio processor 1300, a modem 1400, DRAMs 1500a and 1500b, flash memories 1600a and 1600b, I/O devices 1700a and 1700b, and an AP 1800. The system 1000 may be implemented as a laptop computer, a mobile phone, a smartphone, a tablet PC, a wearable device, a healthcare device, and/or an IoT device. In addition, the system 1000 may be implemented as a server or a PC.

The camera 1100 may capture a still image or a video according to a user's control, and may store the captured image/video data or transmit the image/video to the display 1200. The audio processor 1300 may process audio data included in the content of the flash memory 1600a and 1600b or a network. The modem 1400 may modulate and transmit a signal to transmit/receive wired/wireless data, and a receiver may demodulate the signal to restore the original signal thereof. The I/O devices 1700a and 1700b may include devices providing digital input and/or output functions, such as a universal serial bus (USB) or storage, a digital camera, a secure digital (SD) card, a digital versatile disc (DVD), a network adapter, and a touch screen.

The AP 1800 may control the overall operation of the system 1000. The AP 1800 may control the display 1200 so that a portion of the content stored in the flash memory 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data operation, or may include an accelerator chip 1820 separately from the AP 1800. The DRAM 1500b may be additionally mounted on the accelerator block or accelerator chip 1820. An accelerator is a function block that professionally performs a certain function of the AP 1800, and the accelerator may include a GPU that is a function block professionally performing graphic data processing, a neural processing unit (NPU) that is a block professionally performing AI calculation and inference, and a data processing unit (DPU) that is a block professionally performing data transmission.

The system 1000 may include the DRAMs 1500a and 1500b. The AP 1800 may control the DRAMs 1500a and 1500b through a command and mode register (MRS) setting conforming to the JEDEC standard or may set a DRAM interface protocol to use company-specific functions such as low voltage/high speed/reliability and cyclic redundancy check (CRC)/error correction code (ECC) function to perform communication. For example, the AP 1800 may communicate with the DRAM 1500a through an interface conforming to the JEDEC standard such as LPDDR4 and LPDDR5, and the accelerator block or accelerator chip 1820 may set a new DRAM interface protocol to control the DRAM 1500b for an accelerator having a higher bandwidth than the DRAM 1500a to perform communication.

Although only the DRAMs 1500a and 1500b are illustrated in FIG. 14, the inventive concepts are not limited thereto, and any memory, such as a phase-change random access memory (PRAM), a static RAM (SRAM), a magnetic RAM (MRAM), a resistive RAM (RRAM), a ferroelectric RAM (FRAM), or a hybrid RAM may be used as long as a bandwidth, a response speed, and voltage conditions of the AP 1800 or the accelerator chip 1820 are satisfied. The DRAMs 1500a and 1500b have relatively smaller latency and bandwidth than the I/O devices 1700a and 1700b or the flash memories 1600a and 1600b. The DRAMs 1500a and 1500b may be initialized when the system 1000 is powered on, and loaded with an operating system and application data, to be used as temporary storage locations for the operating system and application data or as execution spaces for various software codes.

In the DRAMs 1500a and 1500b, addition/subtraction/multiplication/division operations, vector operations, address operations, or fast Fourier transform (FFT) operations may be performed. In addition, a function for execution used for inference may be performed in the DRAMs 1500a and 1500b. Here, the inference may be performed in a deep learning algorithm using an artificial neural network. The deep learning algorithm may include a training operation of learning a model through various data and an inference operation of recognizing data with the learned model. As some example embodiments, an image captured by the user through the camera 1100 may be signal-processed and stored in the DRAM 1500b, and the accelerator block or accelerator chip 1820 may perform AI data operation to recognize data stored in the DRAM 1500b and data using a function used for inference.

The system 1000 may include a plurality of storages or a plurality of flash memories 1600a and 1600b having a larger capacity than the DRAMs 1500a and 1500b. The accelerator block or accelerator chip 1820 may perform a training operation and AI data operation by using the flash memory 1600a and 1600b. In some example embodiments, the flash memories 1600a and 1600b may perform the training operation and inference AI data operation, which are performed by the AP 1800 and/or the accelerator chip 1820, more efficiently. The flash memories 1600a and 1600b may store pictures taken through the camera 1100 or data transmitted through a data network. For example, the flash memories 1600a and 1600b may store augmented reality (AR)/virtual reality (VR), high definition (HD), or ultra HD (UHD) content.

In the system 1000, the DRAMs 1500a and 1500b may include first and second memory ranks, and controller 1810 of the AP 1800 may control power of DRAMs 1500a and 1500b. During memory access so that a data toggle time without a data bubble is equal to or greater than an IPD minimum gain duration in access between different bands and/or different band groups for the second memory rank, the controller 1810 causes the first memory rank to enter the IPD state, and during short memory accessing, the controller 1810 may cause the first memory rank to enter the APD state. The DRAMs 1500a and 1500b and/or the AP 1800 in the system 1000 may partially or fully combine any of the embodiments described above with reference to FIGS. 1A to 13. Accordingly, power reduction and power efficiency may be improved by entering the IPD or APD state in consideration of the page access pattern for each memory rank. In addition, in the IPD or APD period, a refresh time point and/or the refresh bank order are determined by refresh postpone, pull-in, or reordering for the corresponding rank, and refresh is performed using the refresh bank order, so that a situation in which the corresponding rank unnecessarily exits the IPD and the APD before the IPD minimum gain duration and the APD minimum gain duration may be delayed as much as possible.

The electronic device 100 (or other circuitry, for example, the application processor 110, memory controller 112, memory system 120, PAPCC circuit 212, RPT 502, request queue 504, IPD minimum gain duration information storage unit (or minimum power gain duration for IPD) 506, APD minimum gain duration information storage unit (or minimum power gain duration for APD) 508, DRAM timing parameter manager 510, data toggle estimator (or DQ toggle (tPH/tPM/tBGd) estimator) 512, power management unit 514, comparator 516, IPDE counter 518, APDE counter 520, refresh controller 902, system 1000 and related subsystems) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:
1. An electronic device comprising:
    a memory system including first and second memory ranks; and
    a memory controller connected to the memory system and configured to control power of the memory system,
    the memory controller further configured to cause the first memory rank to enter an idle power down (IPD) state during memory access in which a data toggle time without a data bubble is equal to or greater than an IPD minimum gain duration in another bank access for the second memory rank; and
    wherein the IPD minimum gain duration includes a rank-to-rank switching time, a per-bank refresh cycle time and a delay time from issuance of an active command to application of a write/read command.
2. The electronic device of claim 1, wherein the other bank access is configured to be performed between different bank groups of the second memory rank.
3. The electronic device of claim 1, wherein
    the memory controller is configured to cause the first memory rank to enter the IPD state by performing a downcounting operation using a count value, and the count value is set as a waiting time for preparing for a possibility of an access request for the first memory rank or the second memory rank before entering the IPD state.

4. The electronic device of claim 1, wherein the memory controller is configured to cause the first memory rank to enter the IPD state during memory access in which a page hit and miss processing time of the second memory rank is equal to or greater than the IPD minimum gain duration.

5. The electronic device of claim 1, wherein the memory controller is configured to postpone a refresh operation of the first memory rank during the IPD minimum gain duration, and cause the first memory rank to enter the IPD state.

6. The electronic device of claim 5, wherein the memory controller is configured to set a refresh postpone period of the first memory rank to be greater than the IPD minimum gain duration.

7. The electronic device of claim 1, wherein the memory controller is configured to pull in a refresh operation of the first memory rank before the first memory rank enters the IPD state.

8. The electronic device of claim 1, wherein the memory controller is configured to pull in a refresh operation of the first and second memory ranks during a memory training operation period for the first and second memory ranks.

9. The electronic device of claim 1, wherein the memory controller is configured to pull in a refresh operation of the first and second memory ranks during a delay locked loop update of a memory physical layer connected to the first and second memory ranks.

10. The electronic device of claim 1, wherein the memory controller is configured to pull in a refresh operation of the first and second memory ranks based on a read operation and a write operation being switched to each other from the first memory rank to the second memory rank.

11. The electronic device of claim 1, wherein the memory controller is configured to pull in a refresh operation of a corresponding rank based on a read operation and a write operation being switched to each other in each of the first and second memory ranks.

12. The electronic device of claim 1, wherein the memory controller is configured to pull in a refresh operation of a corresponding rank for a delay time due to a page miss or collision in each of the first and second memory ranks.

13. The electronic device of claim 1, wherein the memory controller is configured to reorder a refresh order for banks of the first and second memory ranks waiting in a request queue before the first memory rank enters the IPD state.

14. An electronic device comprising:
a memory system including first and second memory ranks;
a memory controller connected to the memory system and configured to control power of the memory system,
the memory controller further configured to cause the first memory rank to enter an active power down (APD) state based on there being an open page for the first memory rank during memory access in which a data toggle time without a data bubble is shorter than an idle power-down (IPD) minimum gain duration in another bank access for the second memory rank; and
wherein the IPD minimum gain duration includes a rank-to-rank switching time, a per-bank refresh cycle time and a delay time from issuance of an active command to application of a write/read command.

15. The electronic device of claim 14, wherein the other bank access is configured to be performed between different bank groups of the second memory rank.

16. The electronic device of claim 14, wherein
the memory controller is configured to cause the first memory rank to enter the APD state by performing a downcounting operation using a count value, and
the count value is set as a waiting time for preparing for a possibility of an access request for the first memory rank or the second memory rank before entering the APD state.

17. The electronic device of claim 14, wherein the memory controller is configured to cause the first memory rank to enter the APD state during memory access in which the data toggle time without a bubble is greater than an APD minimum gain duration for the second memory rank.

18. The electronic device of claim 14, wherein the memory controller is configured to cause the first memory rank to enter the APD state during memory access in which a page hit processing time according to a page hit state of the first memory rank is shorter than an tRCD+RL time that is a sum of a last-to-cas delay time and a read latency time, based on there being no open page for the first memory rank during the data toggle time without the data bubble for the second memory rank.

19. The electronic device of claim 18, wherein the memory controller is configured to cause the first memory rank to enter the APD state during memory access in which the page hit processing time based on any one page of the first memory rank being closed is shorter than the tRCD+RL time, in response to memory accessing in which the page hit processing time of the first memory rank is greater than the tRCD+RL time.

20. The electronic device of claim 19, wherein the memory controller is configured to close a page having a relatively low priority during scheduling the first memory rank.

* * * * *